(12) United States Patent
Pierrat

(10) Patent No.: US 8,198,188 B1
(45) Date of Patent: Jun. 12, 2012

(54) SELF-ALIGNED VIAS FOR SEMICONDUCTOR DEVICES

(75) Inventor: Christophe Pierrat, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 354 days.

(21) Appl. No.: 12/361,393

(22) Filed: Jan. 28, 2009

Related U.S. Application Data

(60) Provisional application No. 61/024,140, filed on Jan. 28, 2008, provisional application No. 61/024,144, filed on Jan. 28, 2008.

(51) Int. Cl.
*H01L 21/44* (2006.01)
*H01L 23/48* (2006.01)
*G06F 17/50* (2006.01)

(52) U.S. Cl. ........ 438/618; 438/622; 257/758; 257/775; 716/100

(58) Field of Classification Search .................. None
See application file for complete search history.

(56) References Cited

U.S. PATENT DOCUMENTS

| | | | | |
|---|---|---|---|---|
| 4,766,476 A * | 8/1988 | Schallenberger et al. | .... | 257/206 |
| 4,916,521 A * | 4/1990 | Yoshikawa et al. | .......... | 257/412 |
| 5,049,969 A * | 9/1991 | Orbach et al. | ................ | 257/211 |
| 5,329,162 A * | 7/1994 | Nadaoka | ...................... | 257/774 |
| 5,510,999 A * | 4/1996 | Lee et al. | ...................... | 716/113 |
| 5,546,225 A * | 8/1996 | Shiraishi | ....................... | 359/559 |
| 5,616,961 A * | 4/1997 | Kohyama | ...................... | 257/774 |
| 5,777,383 A * | 7/1998 | Stager et al. | .................. | 257/700 |
| 5,883,434 A * | 3/1999 | Noguchi | ........................ | 257/750 |
| 5,891,799 A * | 4/1999 | Tsui | ............................... | 438/624 |
| 5,905,307 A * | 5/1999 | Onoda | .......................... | 257/775 |
| 5,985,746 A * | 11/1999 | Kapoor | ......................... | 438/622 |
| RE36,837 E * | 8/2000 | Kohyama | ...................... | 257/774 |
| 6,150,256 A * | 11/2000 | Furukawa et al. | ............ | 438/618 |
| 6,151,568 A * | 11/2000 | Allen et al. | ..................... | 703/14 |
| 6,275,971 B1 * | 8/2001 | Levy et al. | .................... | 716/136 |
| 6,316,836 B1 * | 11/2001 | Mayuzumi | .................... | 257/775 |
| 6,323,118 B1 * | 11/2001 | Shih et al. | ..................... | 438/624 |
| 6,323,556 B2 * | 11/2001 | Izumi | ............................ | 257/758 |
| 6,383,929 B1 * | 5/2002 | Boettcher et al. | ............ | 438/687 |
| 6,732,345 B2 * | 5/2004 | Kato | .............................. | 716/122 |
| 6,737,748 B2 * | 5/2004 | Bauch et al. | ................... | 257/763 |
| 6,779,167 B2 * | 8/2004 | Igarashi et al. | ................ | 257/774 |
| 6,826,792 B2 * | 12/2004 | Lin | ................................ | 5/421 |
| 6,911,389 B2 * | 6/2005 | Brennan et al. | ............... | 438/622 |
| 7,041,592 B2 * | 5/2006 | Kim et al. | ..................... | 438/618 |
| 7,056,821 B2 * | 6/2006 | Yang et al. | .................... | 438/618 |
| 7,061,112 B2 * | 6/2006 | Takao | ........................... | 257/758 |
| 7,124,389 B2 * | 10/2006 | Igarashi et al. | ............... | 257/775 |
| 7,134,111 B2 * | 11/2006 | Nakamoto | ..................... | 257/774 |
| 7,444,614 B2 * | 10/2008 | Maeno et al. | ................... | 716/50 |
| 7,650,584 B2 * | 1/2010 | Shiga et al. | ................... | 716/118 |
| 7,694,260 B2 * | 4/2010 | Tamiya | ......................... | 716/126 |

* cited by examiner

*Primary Examiner* — Scott B Geyer
(74) *Attorney, Agent, or Firm* — Kenyon & Kenyon LLP

(57) ABSTRACT

A semiconductor device and systems and methods for forming a semiconductor device are provided. A method of manufacturing a semiconductor device can include patterning a first conductive element on a first layer of a semiconductor device, patterning a second conductive element on a second layer of a semiconductor device, and forming an electrical connection in a third layer of the semiconductor device at a predetermined location between the first and the second conductive elements, the connection between the first and the second conducting elements having a geometry that is larger in at least one dimension relative to the corresponding dimension of the second conductive element at the predetermined location.

17 Claims, 15 Drawing Sheets

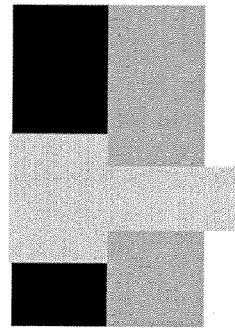

Assumptions
Cu Cap Height = 50nm
Hardmask height = NA
Via height = 210nm
Trench height = 230nm
Minimum L/S = 140nm

Assumptions
$K_{(Cu\ Cap)}$ = 5.0
$K_{(Hardmask)}$ = NA
$K_{(via)}$ = 3.0
$K_{(trench)}$ = 3.0
$K_{eff}$ = 3.24

*Fig. 2A*
(Prior Art)

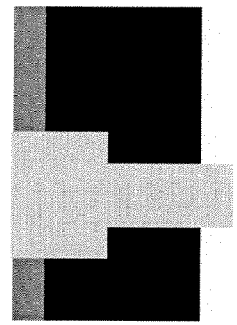

Assumptions
Cu Cap Height = 50nm
Hardmask height = 50nm
Via height = 210nm
Trench height = 230nm
Minimum L/S = 140nm

Assumptions
$K_{(Cu\ Cap)}$ = 5.0
$K_{(Hardmask)}$ = 4.1
$K_{(via)}$ = 2.65
$K_{(trench)}$ = 2.65
$K_{eff}$ = 3.05

*Fig. 2B*
(Prior Art)

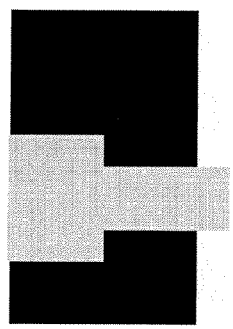

Assumptions
Cu Cap Height = 50nm
Hardmask height = 50nm
Via height = 210nm
Trench height = 230nm
Minimum L/S = 140nm

Assumptions
$K_{(Cu\ Cap)}$ = 5.0
$K_{(Hardmask)}$ = 4.1
$K_{(via)}$ = 3.7
$K_{(trench)}$ = 2.65
$K_{eff}$ = 3.54

*Fig. 2C*
(Prior Art)

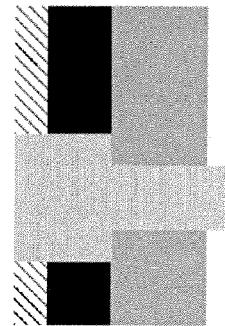

Assumptions
Cu Cap Height = 35nm
Hardmask height = NA
Via height = 150nm
Trench height = 170nm
Minimum L/S = 100nm

Assumptions
$K_{(Cu\ Cap)}$ = 4.0
$K_{(Hardmask)}$ = NA
$K_{(via)}$ = 2.8
$K_{(trench)}$ = 2.8
$K_{eff}$ = 2.96

*Fig. 2D*
(Prior Art)

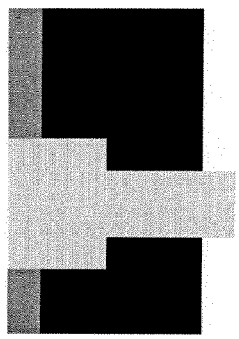

Assumptions
Cu Cap Height = 35nm
Hardmask height = 35nm
Via height = 150nm
Trench height = 170nm
Minimum L/S = 100nm

Assumptions
$K_{(Cu\ Cap)}$ = 4.0
$K_{(Hardmask)}$ = 3.0
$K_{(via)}$ = 2.65
$K_{(trench)}$ = 2.65
$K_{eff}$ = 2.83

*Fig. 2E*
(Prior Art)

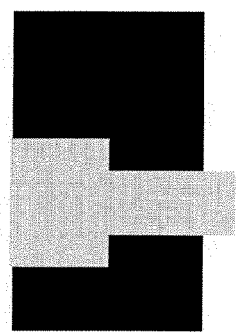

Assumptions
Cu Cap Height = 35nm
Hardmask height = 35nm
Via height = 150nm
Trench height = 170nm
Minimum L/S = 100nm

Assumptions
$K_{(Cu\ Cap)}$ = 4.0
$K_{(Hardmask)}$ = 3.0
$K_{(via)}$ = 2.5
$K_{(trench)}$ = 2.4
$K_{eff}$ = 2.71

*Fig. 2F*
(Prior Art)

SELF-ALIGNED VIAS FOR SEMICONDUCTOR DEVICES

REFERENCE TO RELATED APPLICATIONS

This application claims the benefit of U.S. Provisional Application No. 61/024,140 and U.S. Provisional Application No. 61/024,144 both of which were filed on Jan. 28, 2008.

TECHNICAL FIELD

The present invention relates to device manufacturing, and more particularly, some embodiments relate to semiconductor device patterning techniques.

DESCRIPTION OF THE RELATED ART

Integrated circuits, or ICs, are generally created by patterning a plurality of devices and their interconnects onto a substrate such as a semiconductor wafer. This process generally starts with a design for the circuit or circuits that will make up the IC. A top-down design methodology is commonly employed using hardware description languages through which the designer creates an integrated circuit by hierarchically defining functional components of the circuit. From this high-level functional description, a physical circuit implementation dataset is created, which is usually in the form of a netlist. This netlist identifies logic cell instances from a target standard cell library, and describes cell-to-cell connectivity.

A layout file is then created using the netlist. This is accomplished through a layout and routing process, which assigns logic cells to physical locations in the device layout and routes their interconnections. This layout can be transferred or applied to the semiconductor substrate in a series of layers that collectively form the devices that make up the components of the integrated circuit. A process by which such layers are patterned on the substrate is known as photolithography. During photolithography, a series of photomasks created from the layout file are used to transfer the layout onto the substrate layer by layer. A photomask, or mask, provides an image of the physical geometries of its respective integrated circuit layer. Passing light through transparent sections defined by the mask elements transfers the layout pattern for the layer onto the wafer. An imaging lens system projects and focuses the layout onto the substrate at the desired size. The projected light pattern interacts with a photosensitive coating on the wafer and, depending on the coating used, it is cured or rendered susceptible to removal in the areas that were exposed to the light. Accordingly, the projection of the mask pattern onto the coating can be used to transfer the pattern to the wafer.

With a continuing desire to provide greater functionality in smaller packages and the evolution of system-on-chip and mixed-signal designs, IC feature geometries are being driven to smaller and smaller dimensions. However, the ability to project an accurate image of increasingly smaller features onto the wafer is limited by the wavelength of the light used, and the ability of the lens system to capture enough diffraction orders from the illuminated mask. The minimum feature size that a projection system can print can be approximated by:

$$F = k1 * \frac{\lambda}{N_A}$$

where F is the minimum feature size, k1 is a coefficient of process-related factors, $\lambda$ is the wavelength of light used and $N_A$ is the numerical aperture of the lens as seen from the wafer. With lithography processes using deep ultraviolet light with wavelengths of 248 to 193 nm, minimum feature sizes of approximately 50 nm can be achieved. Accordingly, the resolution limit of conventional lithography technology is increasingly being challenged by the shrinking dimensions of critical IC feature geometries.

Not only are the critical feature geometries decreasing in accordance with, or even faster than, Moore's Law predictions, the already large number of these feature geometries is growing at a dramatic rate as well. Conventional dual Damascene processes can be particularly challenging especially with smaller and smaller geometries. The lithography operations for real levels can be quite challenging and there is very limited process latitude in the printing of small vias. Additionally, with small via sizes impurities can lead to high resistivity or other connectivity issues and the placement of the vias with respect to the metal levels becomes more and more critical as the width of the metallization lines decreases.

BRIEF SUMMARY OF EMBODIMENTS OF THE INVENTION

According to various embodiments of the invention, semiconductor devices and systems and methods for manufacturing semiconductor devices are provided. In one embodiment, a method of manufacturing a semiconductor can include the operations of patterning a first conductive element on a first layer of a semiconductor device; patterning a second conductive element on a second layer of a semiconductor device; and forming electrical connection in a third layer of the semiconductor device at a predetermined location between the first and the second conductive elements, the connection between the first and the second conducting elements having a geometry that is larger in at least one dimension relative to the corresponding dimension of the second conductive element at the predetermined location. In various embodiments, the electrical connection between the first and second conductive elements is larger in a direction perpendicular to the second conductive element.

In some embodiments, the operations of patterning the first conducting element and forming the electrical connection can include patterning a first layer of photoresist on the second layer of the semiconductor device using photolithography; etching the second layer of the semiconductor device in an area exposed by the photoresist pattern to form a first trench; patterning a second layer of photoresist to create an opening in the second layer of photoresist for trenching for the electrical connection, wherein the opening is larger in one dimension relative to the first trench; etching the second and third layers to form a second trench through the second and third layers of the semiconductor device, wherein the second trench is defined by the dimensions of the opening; and depositing a conducting material into the trench formed in the second and third layers. Etching, can comprise a timed-etch process. Additionally, the trench can be defined by the opening in one dimension and a hardmask on the second layer in a second dimension.

In further embodiments, patterning the first layer of photoresist and etching the second layer of the semiconductor device can include etching a plurality of first trenches for a plurality of conductive elements, and wherein the opening in the second layer of photoresist is dimensioned to span the plurality of first trenches. Also, hardmask can be provided on the second layer to confine the etching of the second and third layers to width of the plurality of first trenches in the second layer.

In still other embodiments, a semiconductor device includes a first conductive element on a first layer of the semiconductor device; a second conductive element on a second layer of the semiconductor device; and an electrical connection in a third layer of the semiconductor device disposed at a predetermined location between the first and the second conductive elements, the electrical connection between the first and the second conducting elements having a geometry that is larger in at least one dimension relative to the corresponding dimension of the second conductive element at the predetermined location. In some applications, the electrical connection between the first and second conductive elements is larger in a direction perpendicular to the second conductive element.

In another embodiment, a computer aided design tool for designing a semiconductor device, can include a processor; a memory, coupled to the processor and configured to store instructions. The instructions can be configured to cause the processor to define a dataset used to create a first photomask pattern for a first conductive element to be patterned on a first layer of a semiconductor device; a second photomask pattern for a second conductive element to be patterned on a second layer of a semiconductor device; and a third photomask pattern for an opening to be patterned in a layer of photoresist for trenching an electrical connection between the first and second conductive elements, wherein the opening is larger in one dimension relative to the second conductive element.

In yet another embodiment, a computer program product is provided that includes a computer readable storage medium having computer readable program code embodied therein, the computer readable program code configured to cause a processor to define a dataset used to create a first photomask pattern for a first conductive element to be patterned on a first layer of a semiconductor device; define a dataset used to create a second photomask pattern for a second conductive element to be patterned on a second layer of a semiconductor device; and define a dataset used to create a third photomask pattern for an opening to be patterned in a layer of photoresist for trenching an electrical connection between the first and second conductive elements, wherein the opening is larger in one dimension relative to the second conductive element.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to placements or views as "top," "bottom" or "side" placements or views, such references are merely descriptive and do not imply or require that the invention be implemented or used in a particular spatial orientation unless explicitly stated otherwise.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF HE EMBODIMENTS OF THIS INVENTION

The present invention is directed in various embodiments toward semiconductor devices and systems and methods for semiconductor processing. Particularly, some embodiments relate to an alignment or connection of metal layers in a semiconductor stack. In various embodiments, the via between the first and second conductive levels may be configured to have a larger geometry in at least one dimension relative to a conducting path in one of the conducting levels. In some embodiments, the via size is increased by increasing at least one of its lateral dimensions in a direction perpendicular to one of the conductive levels.

Figure 1:
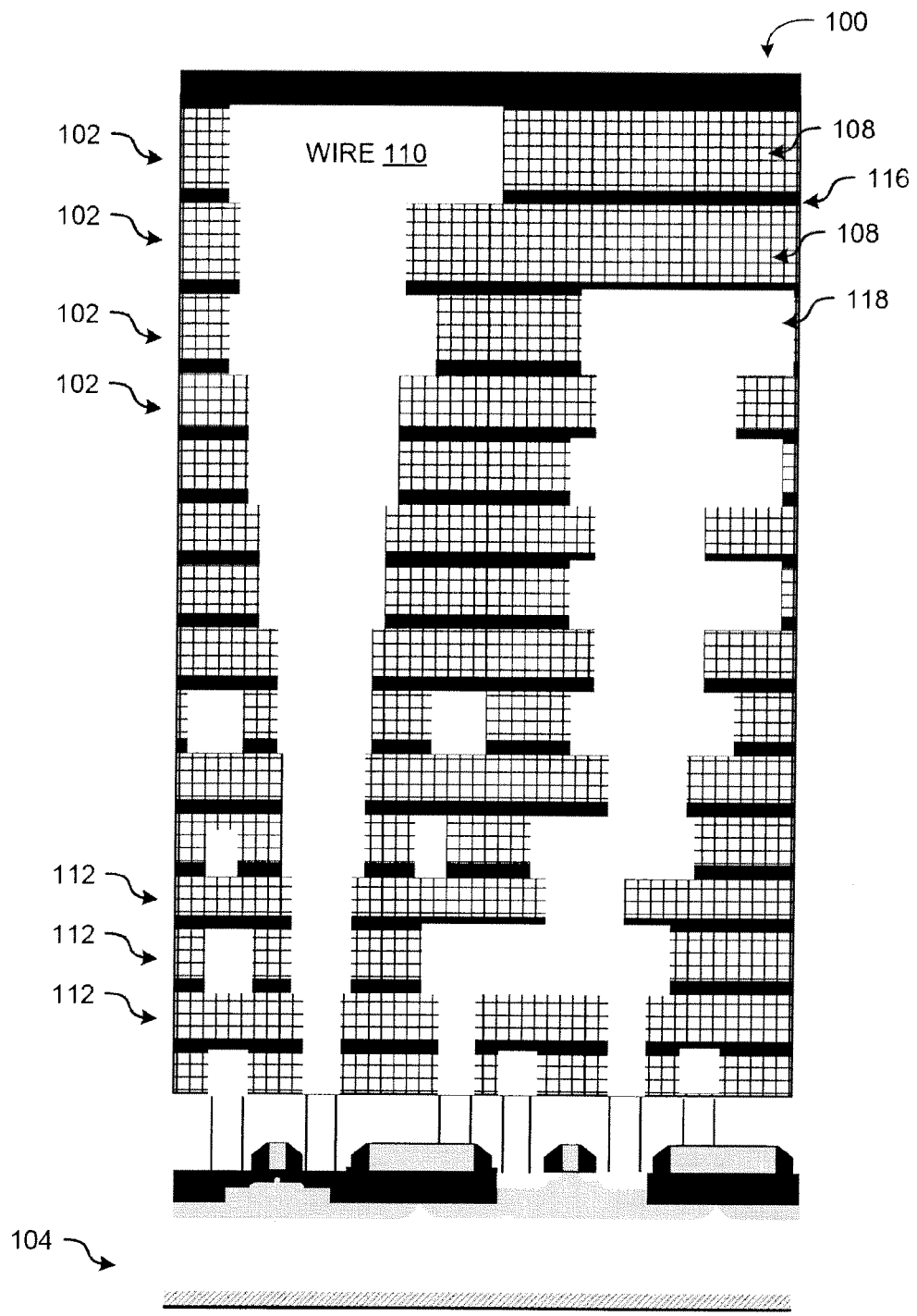
FIG. 1 is a diagram illustrating a cross-sectional view of an example semiconductor device.
Figure 2:
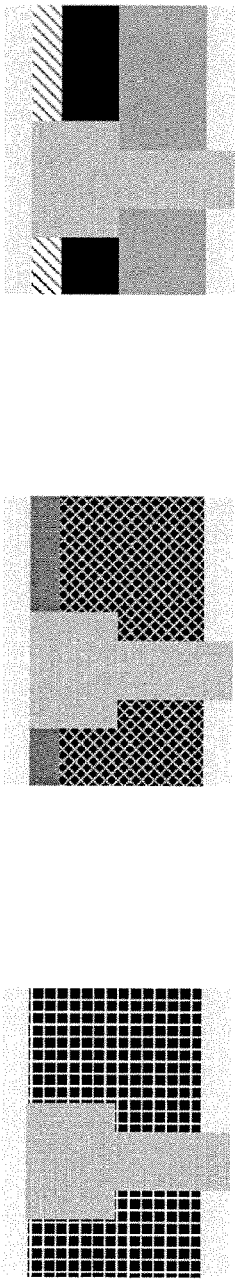
FIGS. 2A-2I are diagrams illustrating a conventional dual damascene copper interconnect assumptions for 90 nm, 65 nm, and 45 nm technologies, respectively.

FIG. 1 is a diagram illustrating a cross-sectional view of an example semiconductor device 100. As this example illustrates, a semiconductor device 100 is typically fabricated with a plurality of layers 102 of material on top of a semiconductor substrate 104. The semiconductor substrate 104 is typically doped to create n and p regions to form devices such as, for example, transistors in the semiconductor substrate 104. Conductive pads can be applied (for example, at the gate, drain and source) to allow electrical connections thereto. The contacts of the devices 100 are interconnected with conductive metals such as aluminum or copper to form circuits. The interconnects between devices are fabricated by forming a plurality of metallization layers 106 in which the conductive interconnects lie. Vias can be included to provide interconnections between conductive elements in different layers. In some embodiments, layers include dielectric material 108, with metal traces 110 therein and can be separated by intermediate layers 112 such as hard mask or etch stop materials. The intermediate layers 112 can be used to better control the etch process. Various embodiments can also include dielectric capping layers 114, etch stop layers 116, and copper conductors with barrier/nucleation layers 118. In some embodiments, a passivation layer 120 may also be applied to the semiconductor device 100.

FIGS. 2A-2I are diagrams illustrating dual damascene copper interconnect assumptions for 90 nm, 65 nm, and 45 nm technologies, respectively. These each assume Cu metal with various dielectric options, and scaling of minimum feature size, via height, trench height and hardmask thickness.

Figure 3:
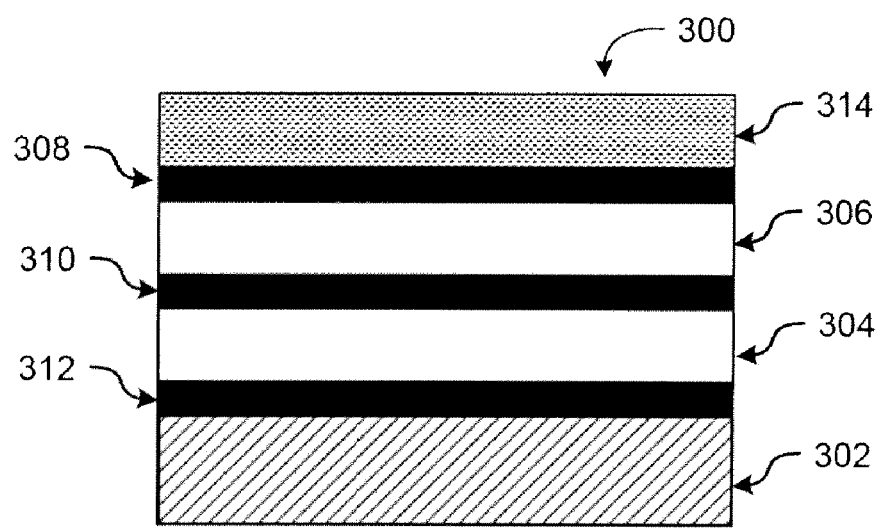
FIG. 3 is a diagram illustrating a traditional dual damascene process in accordance with the systems and methods described herein.

FIGS. 3, 4, and 5A-5C represent traditional dual damascene processes. Particularly, FIG. 3 illustrates a conventional stack 300 or metallization layers of a semiconductor circuit before the copper wires and vias are applied. As illustrated in FIG. 3, the stack 300 includes a semiconductor substrate 302 with a plurality of dielectric layers 304 and 306 deposited thereon. In the example illustration, only two dielectric layers 304 and 306 are shown, however, one of ordinary skill in the art will understand that additional dielectric layers can be utilized.

Also illustrated in the example of FIG. 3, are hard mask layers 308, 310, and 312 interposed between the dielectric layers 304 and 603 and between the lowermost dielectric 304 and substrate layers 302. As one of ordinary skill in the art would also appreciate, hard mask layers 308, 310, and 312 need not be utilized in the stack, but can be included to facilitate the etch process. FIG. 3 also shows a layer of photoresist 314 on the top of the stack 300. Photoresist 314 is typically used in patterning operations and can be applied and selectively removed based on the exposure to light during the photolithography process.

Figure 4A:
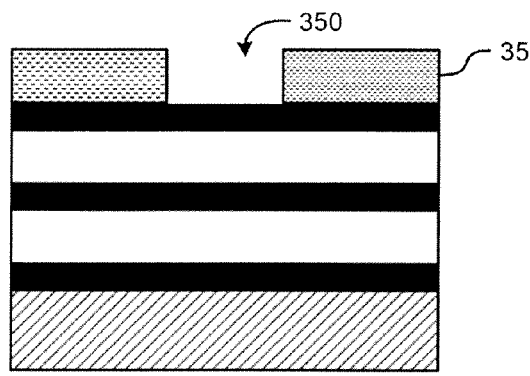
FIGS. 4A-4C are diagrams illustrating a traditional dual damascene process in accordance with the systems and methods described herein.
Figure 4B:
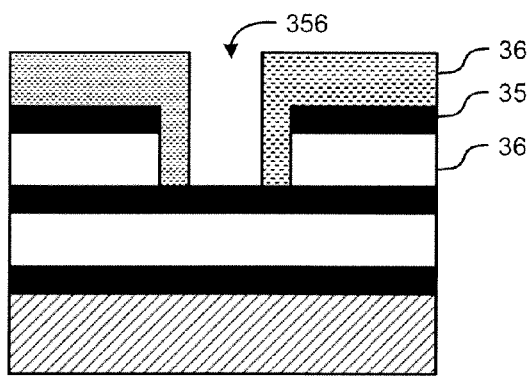
Figure 4C:
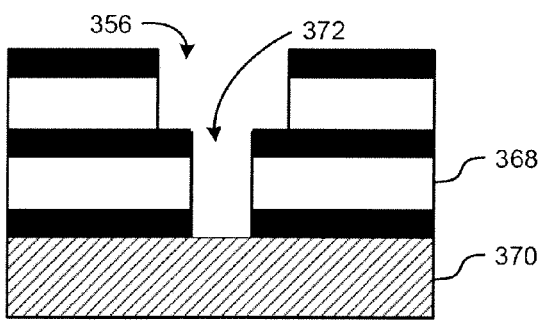
Figure 5A:
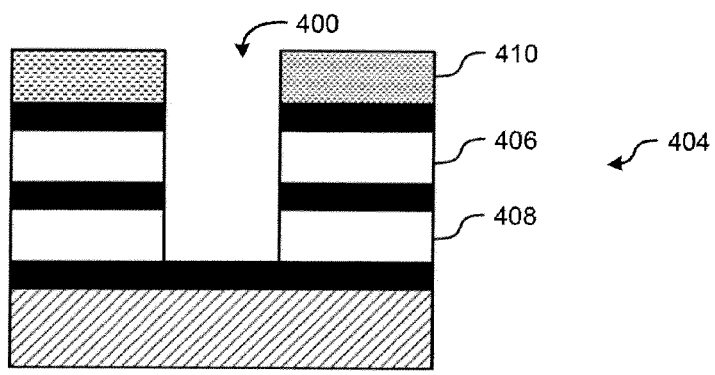
FIGS. 5A-5C are diagrams illustrating a traditional dual damascene process in accordance with the systems and methods described herein.
Figure 5B:
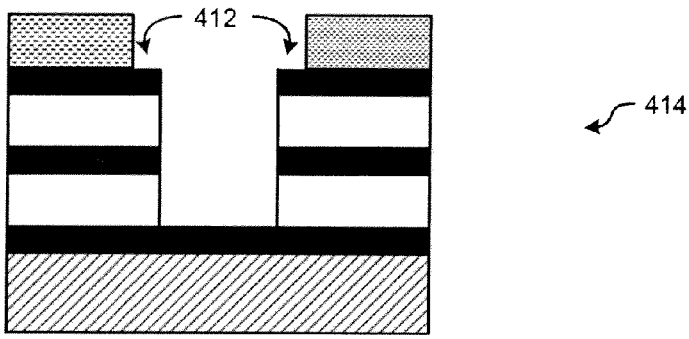
Figure 5C:
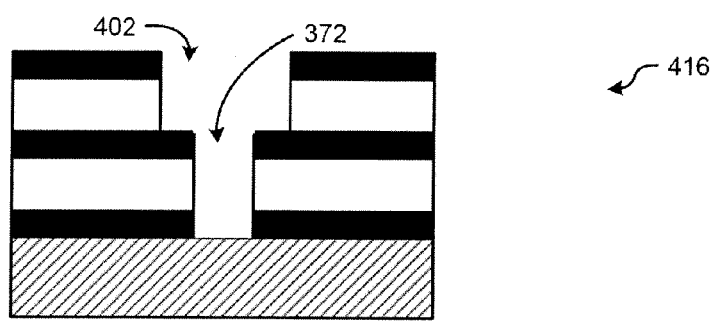

Using the stack 300 of FIG. 3 as an example, FIGS. 4 and 5 illustrate two alternative approaches to dual Damascene interconnects. Particularly, FIGS. 4A-4C illustrate a trench-first process, while FIGS. 5A-5C illustrate a via-first process.

As illustrated in FIGS. 4A-4C, after the first lithography operation, a trench 350 is formed in the photoresist 352. In this operation, the photoresist 352 is selectively exposed to light to facilitate removal of the resist 352 in the desired area 350. This is illustrated in stack 354 of FIG. 4A. After the desired portion 350 of the resist is removed, stack 354 can be etched to form a trench 356 in the top-most layers of the hard mask 358 and dielectric 360. Then, another layer of resist 364 can be applied and, through lithography, selectively removed to create an opening for the via. This is illustrated in the stack 362 of FIG. 4B. With the via opening 356 in the resist, a second layer 368 of dielectric can be etched to the substrate 370 and the resist removed resulting in the trench 372 and via openings 366 as illustrated in stack 374 of FIG. 4C. As described further below with reference to FIGS. 6A-6B, a layer of copper can be applied and planarized create the copper wire and via structures.

As illustrated in FIGS. 5A-5C, the order of the operations in FIGS. 4A-4C are altered such that the via 400 is cut first and then the trench 402. As illustrated in stack 404 of figure after the first lithography and etch operation, a via opening 400 is cut through the first two layers of dielectric 406 and 408. Then, a layer of resist 410 is applied and, after the second lithography operation, the resist 410 is selectively removed 412 to prepare for etching of the trench 402. This is illustrated in stack 412 of FIG. 5B. After the subsequent etch operation, the trench 402 and via 400 are formed in their respective dielectric layers 406 or 408 as illustrated in stack 416 of FIG. 5C.

It is noted that the rightmost stacks 374 and 416 of FIGS. 5A-5C, 6A and 6B illustrate the same resultant structure arrived at using two different approaches. With the stack prepared as illustrated at 374 in FIGS. 4C and 416 in FIG. 5C, the copper metallization can be applied and polished as described below with reference to FIGS. 6A and 6B.

Figure 6A:
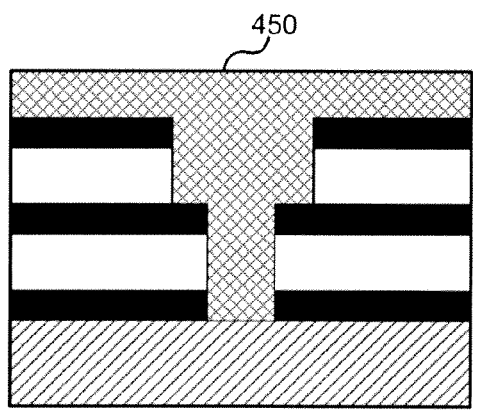
FIGS. 6A and 6B are diagrams illustrating an example of metallization in accordance with the systems and methods described herein.
Figure 6B:
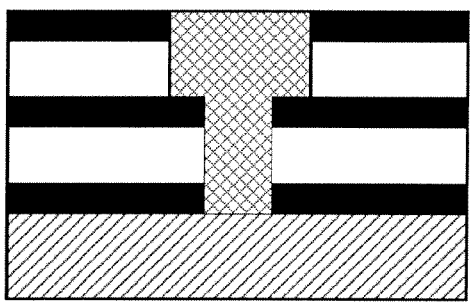

As illustrated in FIGS. 6A and 6B, a layer of copper 450 may be applied as illustrated in stack 452 and polished, as illustrated in stack 454. The polishing may be performed using semiconductor processing operations such as, for example, chemical-mechanical polishing (CMP) to planarize the surface. Planarization can be an important step in the process because it not only removes areas of copper that are not within the trench, but it also properly prepares the surface such that topographical variations do not create difficulties in subsequent lithography operations.

Conventional dual Damascene processes can be particularly challenging especially with smaller and smaller geometries. The lithography operations can be quite challenging and there is very limited process latitude in the printing of small vias. Additionally, the overall reliability of connections between metal levels is limited by the via size. For example, the placement of the vias with respect to the metal levels becomes more and more critical as the width of the metallization lines decreases.

In one embodiment, an alternative is provided for creating vias with a larger geometry, at least in one dimension. In one embodiment, the effective connection area between the metal levels is increased by increasing the via size in at least one dimension. For example, the via size can be increased in a direction perpendicular to one of the metal levels. Accordingly, because an increased area between the metallization layers is utilized for the interconnection, problems associated with alignments of the vias can be minimized or avoided. Likewise, with a larger interconnect area, the device is less sensitive to misalignment between metal levels.

Figure 7A:
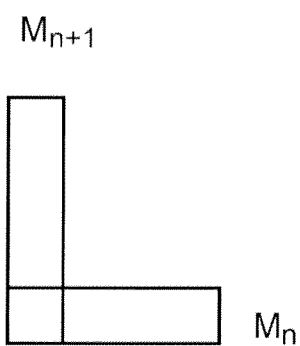
FIGS. 7A and 7B are diagrams illustrating an example of two metallization layers Mn and Mn+1 and an interconnect there between in accordance with the systems and methods described herein.
Figure 7B:
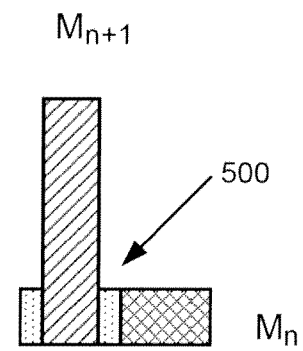

FIGS. 7A and 7B are a diagram illustrating a top-down view of an example of two metallization layers Mn and Mn+1 (referred to as bottom layer Mn and top layer Mn+1). FIG. 7B is a diagram illustrating the same two metallization layers, Mn and Mn+1, with an interconnect (i.e., via 500) there between. In the example illustrated in FIG. 7A, an interconnection is desired at the intersection between the two metal lines Mn and Mn+1. As illustrated in FIG. 7B a via 500 is placed in the location shown between the two metal layers Mn and Mn+1. For clarity, in FIG. 7A the metal lines Mn and Mn+1 are illustrated with out fill patterns so that the extent of the lines and the pattern overlap in this example can be illustrated. Patterns are included for the lines Mn and Mn+1 and the via 500 at FIG. 7B, to aid in illustrating the three components. These patterns correspond with patterns appearing in FIGS. 8A-8C.

Figure 8A:
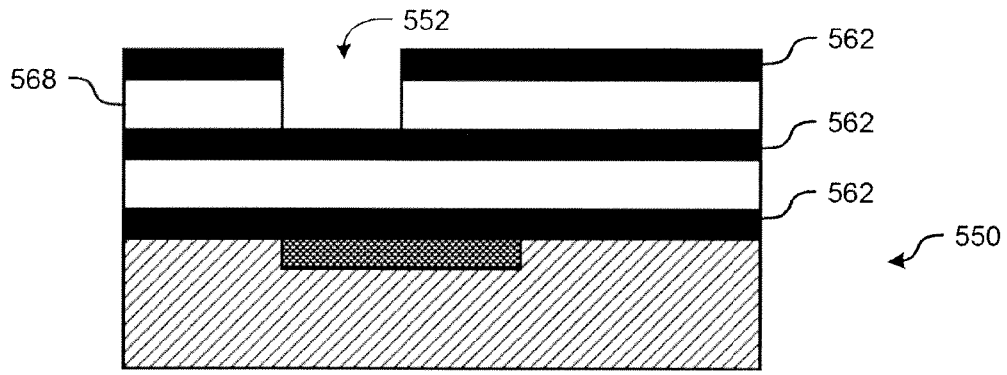
FIGS. 8A-8C are diagrams illustrating a cross-sectional view of a substrate looking in the direction orthogonal to the bottom line Mn in accordance with the system and methods described herein.
Figure 8B:
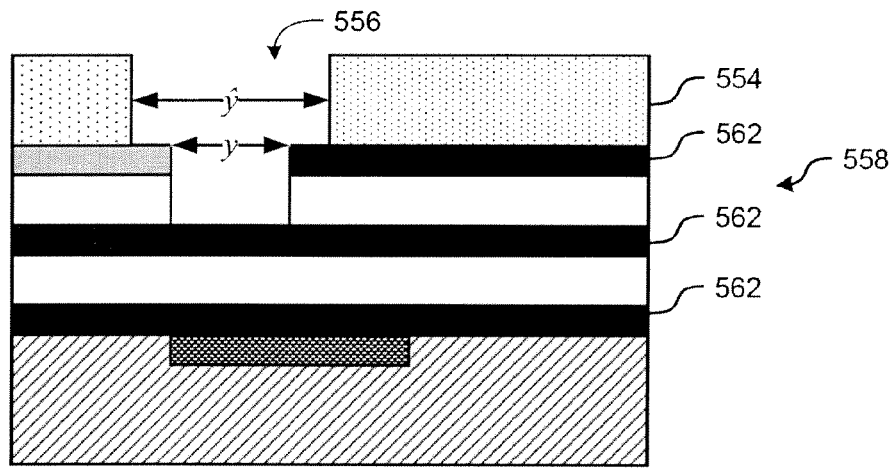
Figure 8C:
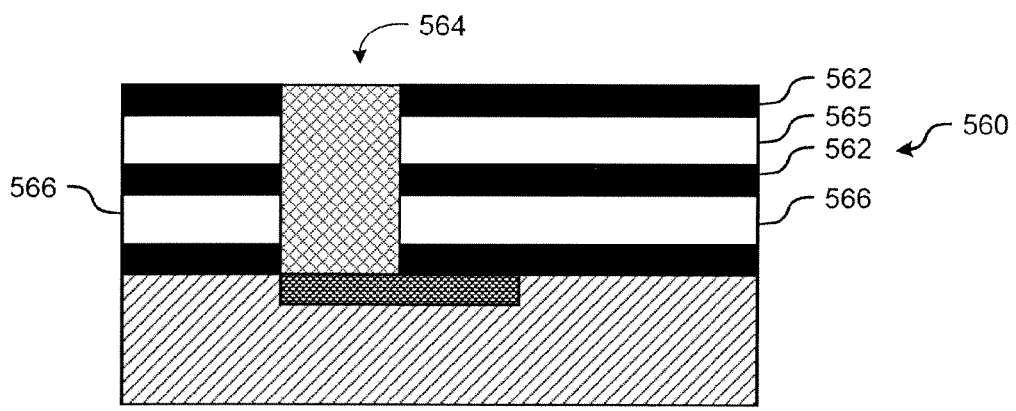

FIGS. 8A-8C provide cross-sectional views of a substrate in a direction orthogonal to the bottom line Mn. As FIG. 8A illustrates, in the top stack 550, a trench 552 is made in the first level 568 to define the top metallization pattern Mn+1 Continuing with the example pattern illustrated in FIGS. 7A and 7B, this trench 552 runs in a direction orthogonal to the page. After the first trench 552 is made, a layer of photoresist 554 is applied and after a lithography operation, a second trench or opening 556 is patterned in the resist layer 554. This is illustrated by stack 558 in FIG. 8B. As illustrated in the example in FIG. 8B, the second trench 556 in the resist layer 554 is wider in dimension ŷ than the width y of first trench 552 for the top line Mn+1 in a direction orthogonal to the top line Mn+1.

Figure 9:
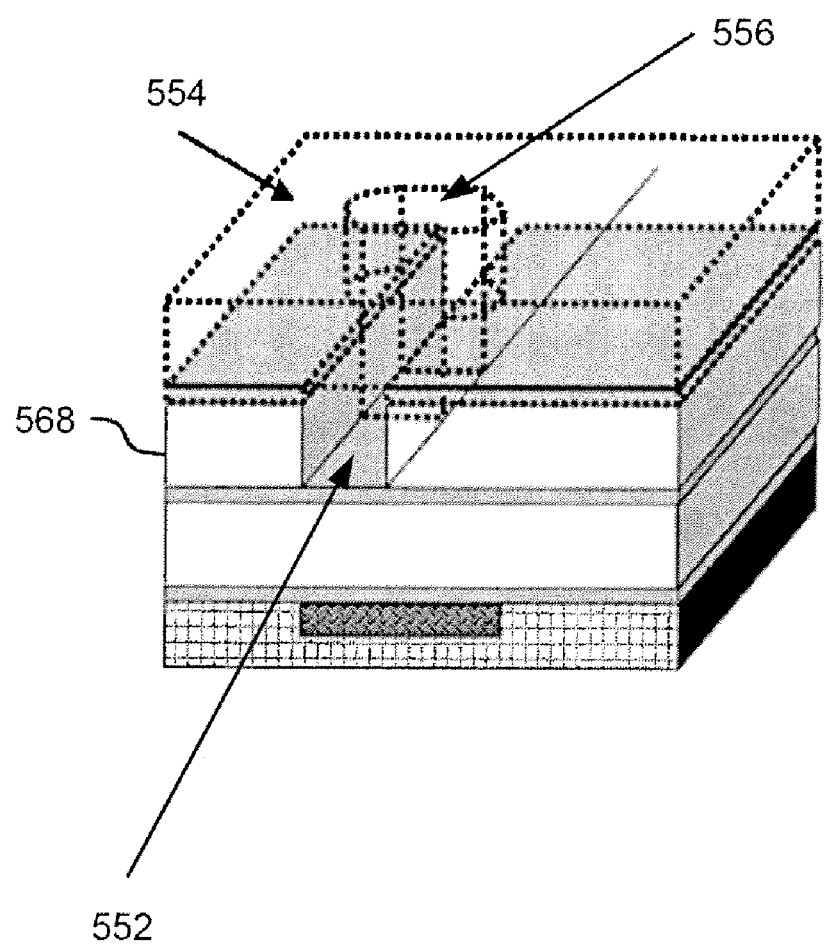
FIG. 9 is a diagram illustrating a three-dimensional view of a via cut out in the resist in accordance with the system and methods described herein.

FIG. 9 is a diagram illustrating a three-dimensional view of the first and second trenches 552, 556 patterned into the first level 568 and into the resist 554. As this example illustrates, the via length is larger than the width of the trench 552 for the top line Mn+1. As can be seen in the example illustrated in FIG. 9, the trench 556 patterned into the resist 554 is longer than the width of the trench 552 for the top line Mn+1 in one dimension and approximately the same width as the bottom line Mn in the other dimension.

Turning now to FIG. 8C, as illustrated in the stack 560, the lower dielectric level 566 and layers of hard mask 562 are etched, tilled with copper 564, and polished, for example, using a chemical mechanical polishing or CMP. Because of hardmask 562 above layer 565, the etch is bounded to the dimensions of the trench 556 in a direction orthogonal to the page, and the width of trench 552 in the y dimension. It is noted that although the example illustrated in FIG. 8 utilizes hard mask 562 for the level 1 and level 2 processes, one of ordinary skill in the art after reading this discussion will understand that hard mask layers 562 need not be utilized to control the depth of the etch process. Accordingly, in another embodiment where a hardmask layer is not used, the wider via opening may be etched into layers 565 and 566. In other words, without hardmask, trench 564 can be etched to have a width ŷ of trench 556.

In the illustrated example, the hard mask 562 used in defining the first level Mn+1, is also used to pattern in the via level. Therefore, even if the via size printed in the resist is larger than a conventional via in a direction perpendicular to the metal Mn+1, the ultimate via etched into the oxide is limited by the width of the metal Mn+1. In a direction parallel to the metal Mn+1, the via width is the same as that of a conventional via.

Figure 10:
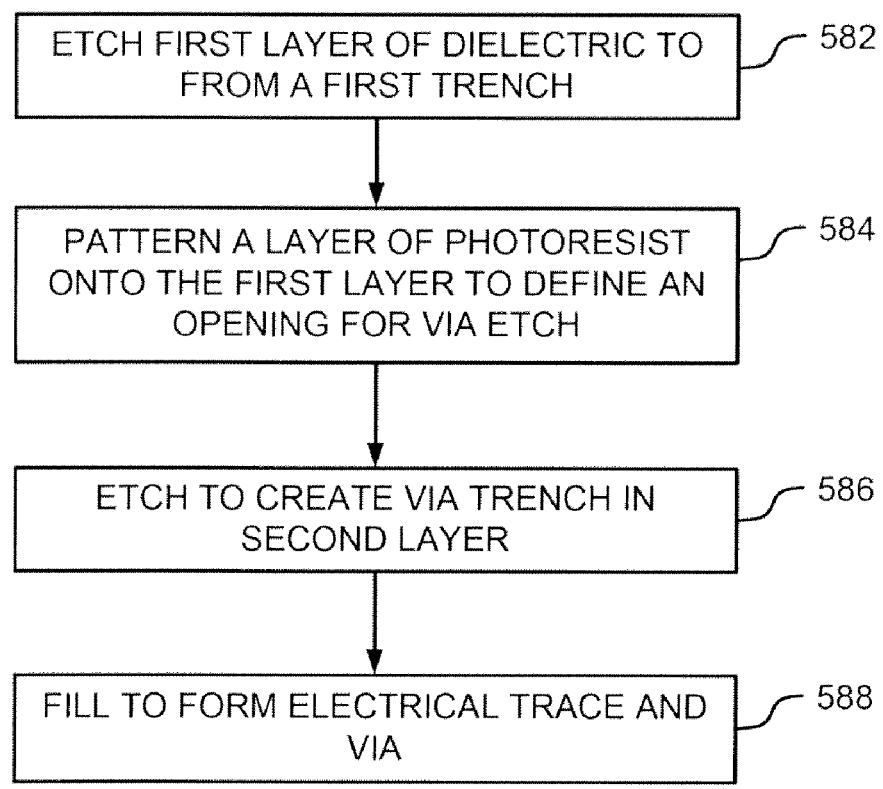
FIG. 10 is a diagram illustrating an example fabrication process for a self-aligned via in accordance with one embodiment of the invention.

FIG. 10 is a diagram illustrating an example process for creating a via in accordance with one embodiment of the invention. Referring now to FIGS. 8A-C, 9 and 10 in a step 582, a first layer of the semiconductor stack is etched to form a trench. In terms of the examples illustrated in FIGS. 8A-8C, a trench 552 is trenched into layer 568. This can be done, for example by patterning a layer of resist through lithography operations and using the resist pattern to define the etch operation.

In a step 584, a pattern for the via etch is defined. As described above, this pattern can be larger than the trace it is going to connect in at least one dimension. In the examples illustrated in FIGS. 8B and 9, a resist pattern 554 is used to define an opening 556 that is larger in one dimension than the width of the trench 552. In this example, opening 556 is larger in a dimension perpendicular to the width of trench 552. This is illustrated as dimensions y and ŷ in FIG. 8B.

In a step 586, the stack is etched using the opening 556 and the trench 552 to bound the etch process. In the examples illustrated in FIGS. 8A-8C, hardmask layer 562 is used to bound the etch process in the y dimension. Then, in a step 588 the trench is filled with conductive material to form the via and the conductive element as shown at 564 in FIG. 8C.

Figure 11A:
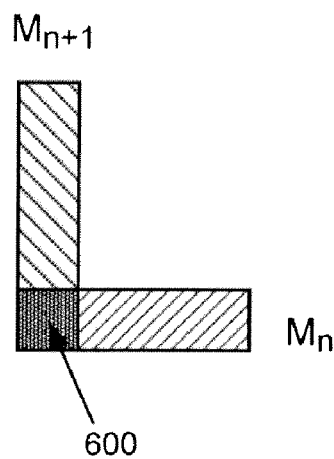
FIGS. 11A-11D are diagrams illustrating conventional vias, and vias in accordance with the systems and methods described herein.
Figure 11B:
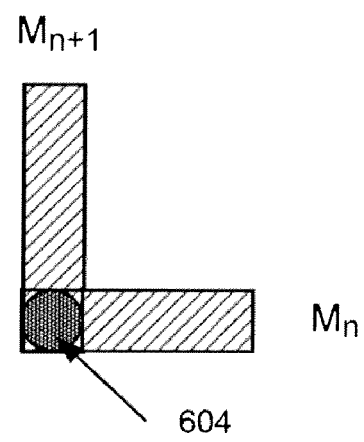
Figure 11C:
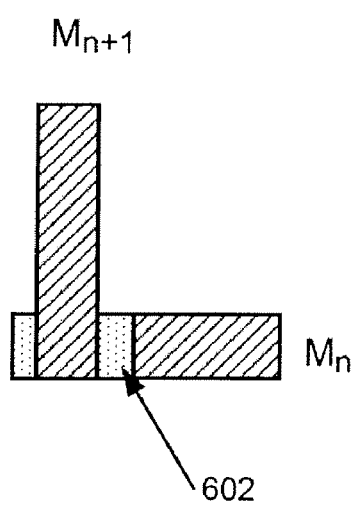
Figure 11D:
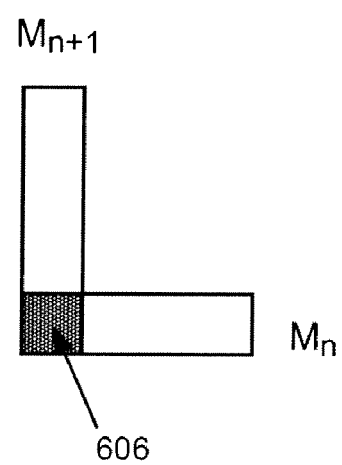

FIGS. 11A and 11B illustrate conventional vias 600, 604 made using conventional processes. FIGS. 11C and 11D illustrate examples of vias 602, 606 made in accordance with the above-described process. More particularly, FIGS. 11A and 11B illustrate the data representation of an ideal conventional via 600 on the left-hand side and an approximation of the final printed shape 604 of the via on the right-hand side. As these examples illustrate, the via 600 is defined as having its dimensions constrained by the overlap of the two metal features to be connected. On the other hand, as illustrated in FIG. 11C, the via 602 in accordance with the above-described process is longer than the width of Mn+1, as illustrated on the left-hand side. Where a hard mask 562 is used as shown above with reference to FIG. 8, this yields an actual printed via with dimensions more closely matching the dimensions defined by the intersection of the top and bottom metal layers. This is illustrated by via 606 on the right-hand side of FIG. 11D. In order to provide clarity to the reader, the hash patterns provided on FIG. 11C are omitted from FIG. 11D to better illustrate the via 606 between the two layers.

Figure 12A:
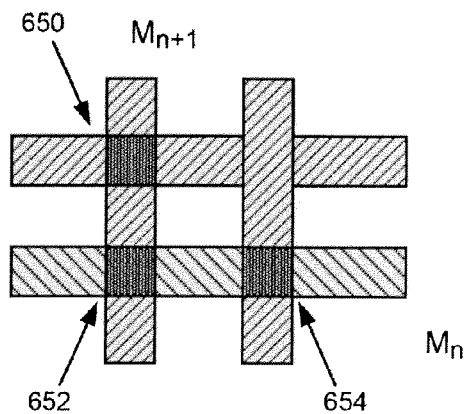
FIGS. 12A-12C are diagrams illustrating adjacent vias that may be merged into a single via in accordance with the system and methods described herein.
Figure 12B:
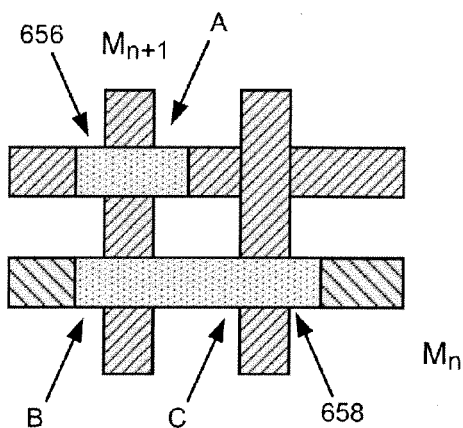
Figure 12C:
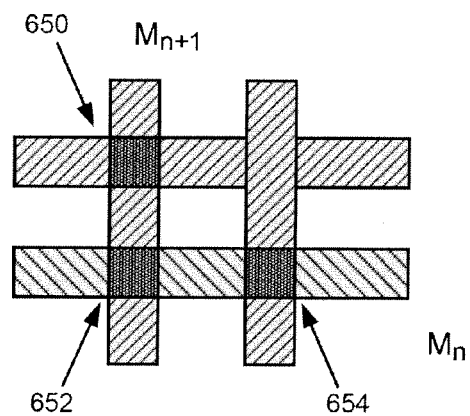

FIGS. 12A-12C are diagrams illustrating further examples of vias in accordance with further embodiments of the invention. FIG. 12A illustrates the original target layout having two metal layers with three of the four intersections between the two layers connected with vias 650, 652, and 654. In one embodiment, adjacent vias 652 and 654 can be merged into a single via shape or opening in the resist layer. FIGS. 12B and 12C illustrate an examples of merged vias in the resist layer (FIG. 12B) and the resulting vias (FIG. 12C). As can be seen by these illustrations, in the case of interconnect A, an increased width via 656 can be used to make the single connection between layers such as, for example, as described above with reference to FIGS. 8A-8C and 9.

For interconnect B and C, a single trench 658 can be patterned in the resist layer to create the via for both connections B and C between the layers. In embodiments where a hard mask layer is used, a subsequent etch process can be prevented from etching a trench in the dielectric the length of the resist layer trench, but instead etches trenches for the vias 652, 654 as illustrated in the right-hand side of FIG. 12B.

Increasing the via size in one dimension can be performed in one embodiment even for dense vias by a maximum of half the minimum via spacing in dense configurations. It is noted that in the embodiments described above, the via size is increased in one dimension in the resist layer but the width of the metal level of the via is not increased and instead remains fixed at the width of the lines. In other words, the printed resist image of the via is larger than the final etched image of the via due to the use of a hard mask layer to limit the via size to the width of the metal Mn+1.

In some embodiments, the invention can be implemented with a dual Damascene process having only one dielectric layer. In such an embodiment, the metal trench etch can be time etched instead of using two dielectric layers separated by an etch stop layer, and a metal trench created by etching the top dielectric until the end point is reached on the etch stop layer. Also, as noted above, the invention can be implemented with two dielectric layers and no etch stop layer.

The substrate can be used to refer to any material onto which a layer of material is disposed. Substrates can be comprised of any of a number of materials or combinations of materials including metals, ceramics, plastics, glass and other materials. Substrates can include semiconductor substrates such as, for example, GaAs, Si, SiGe or any other semiconductor material, and can include, for example, wafers and dice or any other semiconductor structures, including structures in the process of fabrication, having one or more layers formed thereon.

Figure 13:
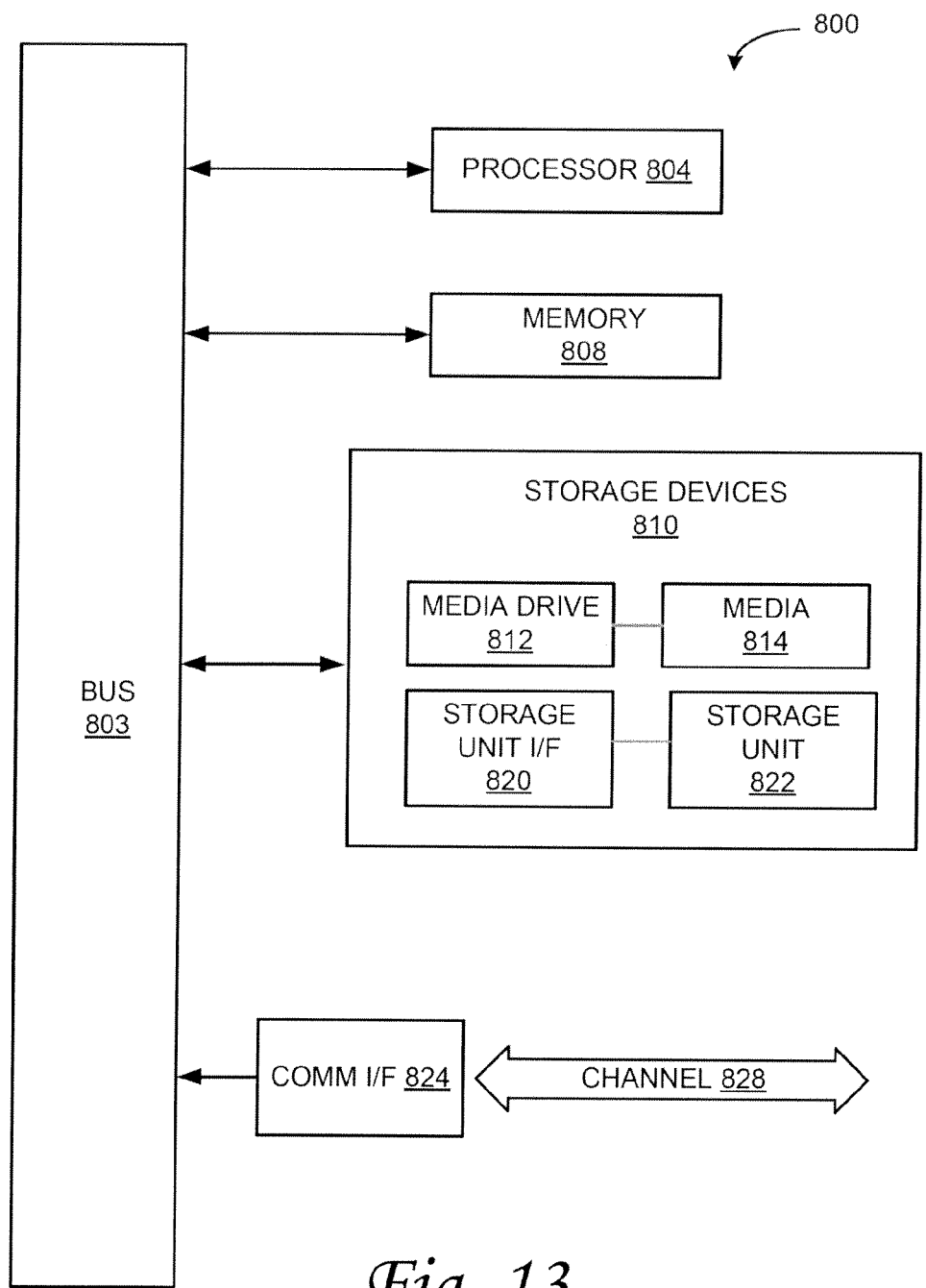
FIG. 13 is a diagram illustrating an example computing module in accordance with the systems and methods described herein.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers. ASICs. PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example-computing module is shown in FIG. 13. Various embodiments are described in terms of this example-computing module 800. After reading this description, it will become apparent to a person skilled in the relevant art how to implement the invention using other computing modules or architectures.

Referring now to FIG. 13, computing module 800 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 800 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 800 might include, for example, one or more processors, controllers, control modules, or other processing devices, such as a processor 804. Processor 804 might be implemented using a general-purpose or special-purpose processing engine such as, for example, a microprocessor, controller, or other control logic. In the example illustrated in FIG. 13, processor 804 is connected to a bus 802, although any communication medium can be used to facilitate interaction with other components of computing module 800 or to communicate externally.

Computing module 800 might also include one or more memory modules, simply referred to herein as main memory 808. For example, preferably random access memory (RAM) or other dynamic memory, might be used for storing information and instructions to be executed by processor 804. Main memory 808 might also be used for storing temporary variables or other intermediate information during execution of instructions to be executed by processor 804. Computing module 800 might likewise include a read only memory ("ROM") or other static storage device coupled to bus 802 for storing static information and instructions for processor 804.

The computing module 800 might also include one or more various forms of information storage mechanism 810, which might include, for example, a media drive 812 and a storage unit interface 820. The media drive 812 might include a drive or other mechanism to support fixed or removable storage media 814. For example, a hard disk drive, a floppy disk drive, a magnetic tape drive, an optical disk drive, a CD or DVD drive (R or RW), or other removable or fixed media drive might be provided. Accordingly, storage media 814, might include, for example, a hard disk, a floppy disk, magnetic tape, cartridge, optical disk, a CD or DVD, or other fixed or removable medium that is read by, written to or accessed by media drive 812. As these examples illustrate, the storage media 814 can include a computer usable storage medium having stored therein computer software or data.

In alternative embodiments, information storage mechanism 810 might include other similar instrumentalities for allowing computer programs or other instructions or data to be loaded into computing module 800. Such instrumentalities might include, for example, a fixed or removable storage unit 822 and an interface 820. Examples of such storage units 822 and interfaces 820 can include a program cartridge and cartridge interface, a removable memory (for example, a flash memory or other removable memory module) and memory slot, a PCMCIA slot and card, and other fixed or removable storage units 822 and interfaces 820 that allow software and data to be transferred from the storage unit 822 to computing module 800.

Computing module 800 might also include a communications interface 824. Communications interface 824 might be used to allow software and data to be transferred between computing module 800 and external devices. Examples of communications interface 824 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 824 might typically be carried on signals, which can be electronic, electromagnetic (which includes optical) or other signals capable of being exchanged by a given communications interface 824. These signals might be provided to communications interface 824 via a channel 828. This channel 828 might carry signals and might be implemented using a wired or wireless communication medium. These signals can deliver the software and data from memory or other storage medium in one computing system to memory or other storage medium in computing system 800. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to physical storage media such as, for example, memory 808, storage unit 820, and media 814. These and other various forms of computer program media or computer usable media may be involved in storing one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 800 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed:

1. A method of manufacturing a semiconductor, comprising:

patterning a first conductive element on a first layer of a semiconductor device;

patterning a second conductive element on a second layer of a semiconductor device; and forming an electrical connection electrically connecting the first and second conductive elements in a third layer of the semiconductor device at a predetermined location between the first and the second conductive elements, the electrical connection between the first and the second conducting elements having a geometry that is larger in at least one dimension relative to the corresponding dimension of the second conductive element at the predetermined location and is the same width as the corresponding dimension of the second conductive element in at least one dimension, wherein the electrical connection between the first and second conductive elements is larger in a direction substantially perpendicular to the second conductive element.

2. The method of claim 1, wherein patterning the first conducting element and forming the electrical connection comprises:

patterning a first layer of photoresist over the second layer of the semiconductor device using photolithography;

etching the second layer of the semiconductor device in an area exposed by the photoresist pattern to form a first trench;

patterning a second layer of photoresist to create an opening in the second layer of photoresist for trenching for the electrical connection, wherein the opening is larger in one dimension relative to the first trench;

etching the second and third layers of the semiconductor device to form a second trench through the second and third layers of the semiconductor device, wherein the second trench is defined by the dimensions of the opening; and depositing a conducting material into the trench formed in the second and third layers of the semiconductor device.

3. The method of claim 2, wherein etching comprises a timed-etch process.

4. The method of claim 2, wherein the trench is defined by the opening in one dimension and a hardmask on the second layer in a second dimension.

5. The method of claim 2, wherein patterning the first layer of photoresist and etching the second layer of the semiconductor device comprises etching a plurality of first trenches for a plurality of conductive elements, and wherein the opening in the second layer of photoresist is dimensioned to span the plurality of first trenches.

6. The method of claim 5, wherein a hardmask is provided on the second layer of the semiconductor device to confine the etching of the second and third layers of the semiconductor device to a width of the plurality of first trenches in the second layer of the semiconductor device.

7. A semiconductor device comprising:
a first conductive element on a first layer of the semiconductor device;
a second conductive element on a second layer of the semiconductor device; and
an electrical connection electrically connecting the first and second conductive elements in a third layer of the semiconductor device disposed at a predetermined location between the first and the second conductive elements, the electrical connection between the first and the second conducting elements having a geometry that is larger in at least one dimension relative to the corresponding dimension of the second conductive element at the predetermined location and is the same width as the corresponding dimension of the second conductive element in at least one dimension,
wherein the electrical connection between the first and second conductive elements is larger in a direction substantially perpendicular to the second conductive element.

8. The semiconductor device of claim 7, manufactured by a process comprising:
patterning a first layer of photoresist over the second layer of the semiconductor device using photolithography;
etching the second layer of the semiconductor device in an area exposed by the photoresist pattern to form a first trench;
patterning a second layer of photoresist to create an opening in the second layer of photoresist for trenching for the electrical connection, wherein the opening is larger in one dimension relative to the first trench;
etching the second and third layers of the semiconductor device to form a second trench through the second and third layers of the semiconductor device, wherein the second trench is defined by the dimensions of the opening; and
depositing a conducting material into the trench formed in the second and third layers of the semiconductor device.

9. The semiconductor device of claim 8 wherein a hardmask is provided on the second layer of the semiconductor device to confine the etching of the second and third layers of the semiconductor device to a width of the plurality of first trenches in the second layer of the semiconductor device.

10. A computer aided design tool for designing a semiconductor device, comprising:

a processor; and
a memory, coupled to the processor and storing instructions configured to cause the processor to define a dataset used to create:
a first photomask pattern for a first conductive element to be patterned on a first layer of a semiconductor device,
a second photomask pattern for a second conductive element to be patterned on a second layer of a semiconductor device, and
a third photomask pattern for an opening to be patterned in a layer of photoresist for trenching an electrical connection between the first and second conductive elements the electrically connects the first and second conductive elements, wherein the opening is larger in one dimension relative to the second conductive element.

11. The computer aided design tool of claim 10, wherein a trench for trenching the electrical connection is defined by the opening in one dimension and a hardmask on the second layer in a second dimension.

12. The computer aided design tool of claim 10, wherein patterning the first layer of photoresist and etching the second layer of the semiconductor device comprises etching a plurality of first trenches for a plurality of conductive elements, and wherein the opening in the second layer of photoresist is dimensioned to span the plurality of first trenches.

13. The computer aided design tool of claim 10, wherein the second photomask pattern is configured to provide a plurality of plurality of second conductive elements, and wherein the opening to be patterned in the layer of photoresist is dimensioned to span the plurality of first trenches.

14. A computer program product comprising a computer readable storage medium having computer readable program code embodied therein, the computer readable program code configured to cause a processor to:
define a dataset used to create a first photomask pattern for a first conductive element to be patterned on a first layer of a semiconductor device;
define a dataset used to create a second photomask pattern for a second conductive element to be patterned on a second layer of a semiconductor device; and
define a dataset used to create a third photomask pattern for an opening to be patterned in a layer of photoresist for trenching an electrical connection between the first and second conductive elements that electrically connects the first and second conductive elements, wherein the opening is larger in one dimension relative to the second conductive element.

15. The computer program product of claim 14, wherein a trench for trenching the electrical connection is defined by the opening in one dimension and a hardmask on the second layer in a second dimension.

16. The computer program product of claim 14, wherein patterning the first layer of photoresist and etching the second layer of the semiconductor device comprises etching a plurality of first trenches for a plurality of conductive elements, and wherein the opening in the second layer of photoresist is dimensioned to span the plurality of first trenches.

17. The computer program product of claim 14, wherein the second photomask pattern is configured to provide a plurality of plurality of second conductive elements, and wherein the opening to be patterned in the layer of photoresist is dimensioned to span the plurality of first trenches.

* * * * *